US010922167B2

(12) United States Patent
Her et al.

(10) Patent No.: US 10,922,167 B2
(45) Date of Patent: Feb. 16, 2021

(54) STORAGE DEVICE AND OPERATING METHOD THEREOF

(71) Applicant: SK hynix Inc., Gyeonggi-do (KR)

(72) Inventors: Min Ho Her, Chungcheongbuk-do (KR); Dong Hyun Kim, Gyeonggi-do (KR); Seung Il Kim, Chungcheongbuk-do (KR); Youn Ho Jung, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/440,536

(22) Filed: Jun. 13, 2019

(65) Prior Publication Data

US 2020/0167227 A1 May 28, 2020

(30) Foreign Application Priority Data

Nov. 22, 2018 (KR) .......................... 10-2018-0145785

(51) Int. Cl.
*G06F 11/10* (2006.01)
*G06F 11/16* (2006.01)
*G06F 9/30* (2018.01)

(52) U.S. Cl.
CPC ...... *G06F 11/1004* (2013.01); *G06F 9/30101* (2013.01); *G06F 11/1016* (2013.01); *G06F 11/165* (2013.01)

(58) Field of Classification Search
CPC ............. G06F 11/1004; G06F 9/30101; G06F 11/1016; G06F 11/165
See application file for complete search history.

(56) References Cited

U.S. PATENT DOCUMENTS

2006/0034452 A1* 2/2006 Tonomura ............. H03M 13/15
380/28
2017/0133106 A1* 5/2017 Viswanathan Pillai ......................
G11C 29/14

FOREIGN PATENT DOCUMENTS

KR 10-2012-0013538 2/2012
KR 10-2012-0077273 7/2012
KR 10-2018-0030319 3/2018

* cited by examiner

*Primary Examiner* — Kyle Vallecillo
(74) *Attorney, Agent, or Firm* — IP & T Group LLP

(57) ABSTRACT

A memory controller for controlling a memory device including a register for storing a plurality of parameters includes: a register information storage configured to store the plurality of parameters as a plurality of setting parameters, a register controller configured to provide the memory device with a parameter change command for requesting a selected parameter to be changed to a set value, and acquire, from the memory device, Cyclic Redundancy Check (CRC) calculation information on the plurality of parameters including the selected parameter, a CRC reference information generator configured to generate CRC reference information on the plurality of setting parameters including at least one setting parameter changed to the set value, and a CRC information comparator configured to determine whether an error is included in the plurality of parameters according to a comparison result between the CRC calculation information and the CRC reference information.

20 Claims, 13 Drawing Sheets

STORAGE DEVICE AND OPERATING METHOD THEREOF

CROSS-REFERENCE TO RELATED APPLICATION

The present application claims priority under 35 U.S.C. § 119(a) to Korean patent application number 10-2018-0145785, filed on Nov. 22, 2018, the entire disclosure of which is herein incorporated by reference in its entirety.

BACKGROUND

Field of Invention

The present disclosure generally relates to an electronic device, and more particularly, to a storage device and an operating method thereof.

Description of Related Art

A storage device stores data under the control of a host device such as a computer or a smart phone. The storage device may include a memory device for storing data and a memory controller for controlling the memory device. The memory device may be a volatile memory device or a nonvolatile memory device.

In a volatile memory device, data is stored only when power is supplied; stored data is lost when the supply of power is interrupted. Examples of a volatile memory device include a Static Random Access Memory (SRAM), a Dynamic Random Access Memory (DRAM), and the like.

In a nonvolatile memory device, data is retained even when the supply of power is interrupted. Examples of a nonvolatile memory device include a Read Only Memory (ROM), a Programmable ROM (PROM), an Electrically Programmable ROM (EPROM), an Electrically Erasable ROM (EEROM), a flash memory, and the like.

SUMMARY

Embodiments provide a storage device having improved reliability and an operating method thereof.

According to an aspect of the present disclosure, there is provided a memory controller for controlling a memory device including a register for storing a plurality of parameters, the memory controller comprising: a register information storage configured to receive, when power is supplied to the memory device, the plurality of parameters from the memory device, and store the plurality of parameters as a plurality of setting parameters respectively corresponding to the plurality of parameters, a register controller configured to provide the memory device with a parameter change command for requesting a selected parameter, among the plurality of parameters, to be changed to a set value, and acquire, from the memory device, Cyclic Redundancy Check (CRC) calculation information that is obtained by performing a CRC calculation on the plurality of parameters including the selected parameter changed in response to the parameter change command, a CRC reference information generator configured to generate CRC reference information by performing a CRC calculation on the plurality of setting parameters including a setting parameter that corresponds to the selected parameter and is changed to the set value, and a CRC information comparator configured to determine whether an error is included in the plurality of parameters according to a comparison result between the CRC calculation information and the CRC reference information.

According to another aspect of the present disclosure, there is provided a memory controller for controlling a memory device including a register for storing a plurality of parameters, the memory controller comprising: a register information storage configured to receive the plurality of parameters from the memory device and store the plurality of parameters as a plurality of setting parameters respectively corresponding to the plurality of parameters, when power is supplied to the memory device, and a register manager configured to provide the memory device with a parameter change command for requesting a selected parameter, among the plurality of parameters, to be changed to a set value, and determine whether an error is included in the plurality of parameters according to whether the selected parameter changed in response to the parameter change command has the set value.

According to still another aspect of the present disclosure, there is provided a memory device including: a register configured to store a plurality of parameters, a register setter configured to change a selected parameter among the plurality of parameters in response to a parameter change command requesting a change of the selected parameter, and a CRC calculation controller configured to perform a CRC calculation on the plurality of parameters including the selected parameter changed in response to the parameter change command.

According to still another aspect of the present disclosure, there is provided a method for operating a memory controller for controlling a memory device including a register for storing a plurality of parameters, the method comprising: receiving the plurality of parameters from the memory device and storing the plurality of parameters as a plurality of setting parameters respectively corresponding to the plurality of parameters in a register information storage, when power is supplied to the memory device, providing the memory device with a parameter change command for requesting a selected parameter, among the plurality of parameters, to be changed to a set value, acquiring, from the memory device, a Cyclic Redundancy Check (CRC) calculation information that is obtained by performing a CRC calculation on the plurality of parameters including the selected parameter changed in response to the parameter change command, generating CRC reference information by performing a CRC calculation on the plurality of setting parameters including a setting parameter that corresponds to the selected parameter and is changed to the set value, and determining whether an error is included in the plurality of parameters according to a comparison result between the CRC calculation information and the CRC reference information.

According to still another aspect of the present disclosure, there is provided a storage device including: a memory device including a register configured to store a plurality of parameters representing device setting information related to the memory device: and a memory controller configured to: receive the plurality of parameters from the memory device and store the plurality of parameters as a plurality of setting parameters respectively corresponding to the plurality of parameters, when power is supplied to the memory device, provide the memory device with a parameter change command for requesting a selected parameter, among the plurality of parameters, to be changed to a set value, and determine whether an error is included in the plurality of parameters according to whether a result obtained by performing a Cyclic Redundancy Check (CRC) calculation on the setting parameters is the same as a result obtained by performing a CRC calculation on the plurality of parameters, wherein the plurality of setting parameters include a setting parameter that corresponds to the selected parameter and is changed to the set value, and wherein the plurality of parameters include the selected parameter changed in response to the parameter change command, which are received from the memory device.

According to still another aspect of the present disclosure, there is provided a memory system comprising: a memory device configured to store a plurality of device parameters representing device setting information; and a controller configured to: control the memory device to change a selected device parameter, among the device parameters, to the set value, store the device parameters as respective setting parameters and update, among the setting parameters, a selected setting parameter corresponding to the selected device parameter according to the change of the selected device parameter and initialize the device parameters when results of cyclic redundancy check (CRC) operations on all the device parameters and all the setting parameters are different from each other.

BRIEF DESCRIPTION OF THE DRAWINGS

Various embodiments will now be described more fully with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Also, throughout the specification, reference to "an embodiment," "another embodiment" or the like is not necessarily to only one embodiment, and different references to any such phrase are not necessarily to the same embodiment(s).

DETAILED DESCRIPTION

Figure 1:
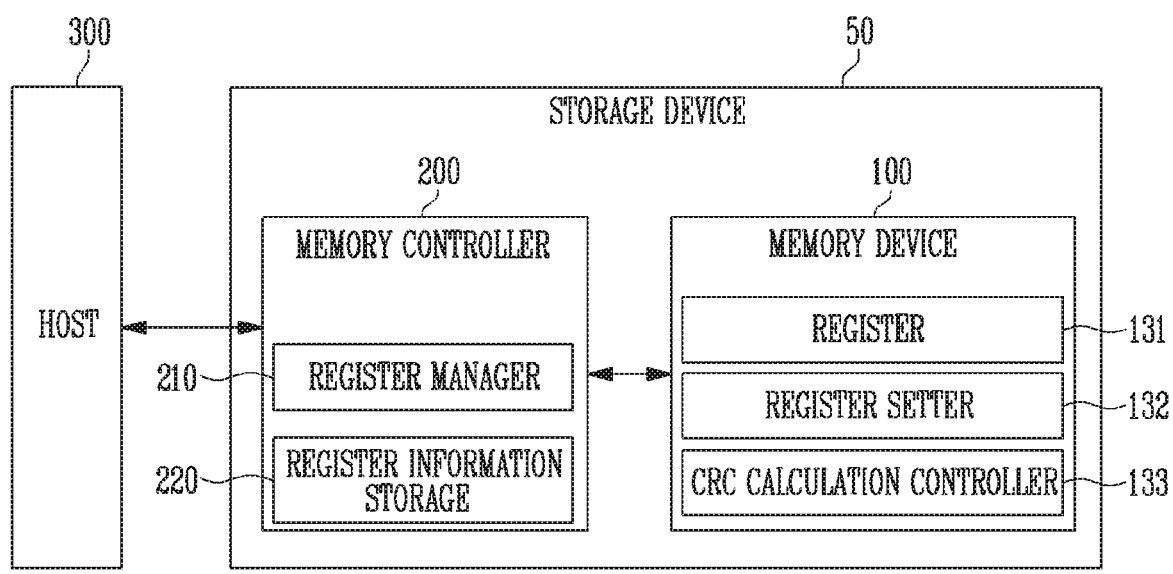
FIG. 1 is a block diagram illustrating a storage device according to an embodiment of the present disclosure.

The specific structural and functional description herein is for the purpose of describing embodiments of the present disclosure. Such embodiments can be implemented in various forms, and thus the present invention is not limited to the embodiments set forth herein.

The embodiments of the present disclosure can be modified in various ways. Thus, while specific embodiments are illustrated and described in detail, the present invention is not limited to specifics disclosed. Rather, the present invention encompasses all changes, equivalents, or substitutes that do not depart from the spirit and technical scope of the present disclosure.

While terms such as "first" and "second" may be used to identify various components, such components are not limited by the above terms. The above terms are used only to distinguish one component from another that otherwise have the same or similar names. For example, a first component in one instance may be referred to as a second component in another instance, and vice versa, without departing from the scope of rights of the present disclosure.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. The articles 'a' and 'an' as used in this application and the appended claims should generally be construed to mean 'one or more' unless specified otherwise or clear from context to be directed to a singular form. It will be further understood that open-ended terms such as "including," "having," etc., are intended to indicate the existence of the stated features, numbers, operations, actions, components, parts, or combinations thereof, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing embodiments, description of techniques that are well known in the pertinent art and not directly related to the present disclosure is omitted. This is done so as not to unnecessarily obscure features and aspects of the present invention.

Various embodiments of the present disclosure are described below in detail with reference to the accompanying drawings in order for those skilled in the art to be able to readily implement or practice the present invention.

FIG. 1 is a block diagram illustrating a storage device according to an embodiment of the present disclosure.

Referring to FIG. 1, the storage device 50 may include a memory device 100 and a memory controller 200 for controlling an operation of the memory device 100.

The storage device 50 may store data under the control of a host 300, such as a mobile phone, a smart phone, an MP3 player, a laptop computer, a desktop computer, a game console, a TV, a tablet PC or an in-vehicle infotainment.

The storage device 50 may be any of various types of storage devices according to a host interface that is a communication scheme with the host 300. For example, the storage device 50 may be implemented with any one of various types of storage devices such as a multi-media card of a Solid State Drive (SSD), a Multi-Media Card (MMC), an embedded, Multi-Media Card (eMMC), a Reduced Size, Multi-Media Card (RS-MMC), and a micro-Multi-Media Card (micro-MMC) type, a Secure Digital (SD) card of a Secure Digital (SD), a mini-Secure Digital (mini-SD) and a micro-Secure Digital (micro-SD) type, an Universal Serial Bus (USB) storage device, a Universal Flash Storage (UFS) device, a storage device of a Personal Computer Memory Card International Association (PCMCIA) card type, a storage device of a Peripheral Component Interconnection (PCI) card type, a storage device of a PCI-Express (PCI-E) card type, a Compact Flash (CF) card, a smart media card, and a memory stick.

The storage device 50 may be manufactured as any of various package types. For example, the storage device 50 may be manufactured as any of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. Various aspects and features of the present invention are described in the context of the memory device 100 being a NAND flash memory. However, the present invention is not limited in that respect.

The memory device 100 receives a command and an address from the memory controller 200 and accesses an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

In an embodiment, the memory device 100 may include a register 131, a register setter 132, and a Cyclic Redundancy Check (CRC) calculation controller 133.

The register 131 may include a latch circuit for storing data. The register 131 may store a plurality of parameters representing device setting information related to the memory device 100. The device setting information may be used to perform a read, program or erase operation of the memory device 100. In a booting operation of the memory device 100, the memory device 100 may read device setting information from a memory cell array included therein and store the read device setting information in the register 131 in response to an initialization command provided by the memory controller 200.

The register setter 132 may change a selected parameter among the plurality of parameters stored in the register 131 in response to a parameter change command provided by the memory controller 200. The parameter change command may be a set parameter command.

The register setter 132 may provide the selected parameter stored in the register 131 to the memory controller 200 in response to a parameter check command for requesting the selected parameter, which is provided by the memory controller 200. The parameter check command may be a get parameter command.

In an embodiment, the register setter 132 may change the selected parameter stored in the register 131 in response to the parameter change command, and provide the changed parameter to the memory controller 200 in response to the parameter check command.

When the selected parameter is changed among the plurality of parameters stored in the register 131, the CRC calculation controller 133 may perform a CRC calculation on all the plurality of parameters including the changed parameter. That is, when the selected parameter is changed in response to the parameter change command received by the register setter 132, the CRC calculation controller 133 may perform a CRC calculation on all the plurality of parameters stored in the register 131. The plurality of parameters may include the changed parameter.

The CRC calculation controller 133 may generate and store CRC calculation information that is obtained by performing the CRC calculation on all the plurality of parameters stored in the register 131. The CRC calculation controller 133 may provide the CRC calculation information to the memory controller 200 in response to a CRC calculation information request command provided by the memory controller 200.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data regardless of a request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme so as to improve operational performance. The interleaving scheme may be an operating scheme that allows operating sections of at least two memory devices 100 to overlap with each other.

In an embodiment, the memory controller 200 may include a register manager 210 and a register information storage 220.

The register manager 210 may manage device setting information related to the memory device 100. Specifically, the register manager 210 may provide the memory device 100 with a command for setting a plurality of parameters representing the device setting information. The setting of a parameter may include addition, change or deletion of the parameter. In an embodiment, the register manager 210 may provide a parameter change command for requesting a selected parameter to be changed to a set value among a plurality of parameters stored in the memory device 100.

The register manager 210 may determine whether an error is included in the plurality of parameters stored in the memory device 100. When the selected parameter is not changed to the set value despite the parameter change command, the register manager 210 may determine that an error is included in the plurality of parameters stored in the memory device 100. Alternatively, when other parameters, i.e., parameters other than the selected parameter, have changed according to the parameter change command, the register manager 210 may determine that an error is included in the plurality of parameters stored in the memory device 100.

In an embodiment, the register manager 210 may determine whether an error is included in the plurality of parameters stored in the memory device 100 according to whether the selected parameter acquired according to the parameter check command has the set value. The parameter check command may be for acquiring the selected parameter from the memory device 100 for the register manager 210 to check whether the selected parameter is correctly changed according to the parameter change command.

When the selected parameter acquired according to the parameter check command does not have the set value, the register manager 210 may determine that an error is included in the plurality of parameters stored in the memory device 100.

When the selected parameter acquired according to the parameter check command has the set value, the register manager 210 may determine whether the other parameters stored in the memory device 100 have been changed. When the other parameters are changed in the memory device 100, the register manager 210 may determine that an error is included in the plurality of parameters stored in the memory device 100.

The register manager 210 may determine whether the other parameters have been changed according to whether CRC reference information is the same as, or corresponds to, CRC calculation information. The register manager 210 may generate the CRC reference information. The CRC reference information may be obtained by performing a CRC calculation on setting parameters stored in the register information storage 220. The setting parameters may include the selected parameter changed to the set value according to the parameter change command.

The register manager 210 may acquire CRC calculation information from the memory device 100. The register manager 210 may provide the memory device 100 with a CRC calculation information request command for requesting the CRC calculation information. The CRC calculation information request command may be a get parameter command. The CRC calculation information may be obtained by performing a CRC calculation on a plurality of parameters stored in the memory device 100. The plurality of parameters may include the selected parameter changed in response to the parameter change command provided by the register manager 210.

When the CRC reference information is not the same as the CRC calculation information, the register manager 210 may determine that the other parameters have been changed. Therefore, the register manager 210 may determine that an error is included in the plurality of parameters stored in the memory device 100.

When it is determined that an error is included in the plurality of parameters stored in the memory device 100, the register manager 210 may initialize the register 131. Specifically, the register manager 210 may provide the memory device 100 with an initialization command for initializing the register 131. The memory device 100 may set each of a plurality of parameters representing device setting information to a set initial value in response to the initialization command. In order to set each of the plurality of parameters to a set initial value, the memory device 100 may read device setting information from a memory cell array therein and store the read device setting information in the register 131.

When power is supplied to the memory device 100, the register information storage 220 may receive a plurality of parameters stored in the memory device 100, and store the plurality of received parameters as setting parameters respectively corresponding to the plurality of parameters. The plurality of parameters may represent device setting information. The register information storage 220 may perform an update operation on the plurality of parameters and store the updated parameters as the setting parameters. The plurality of parameters as a target of the update operation may be provided from the memory device 100 periodically or on demand.

The host 300 may communicate with the storage device 50 using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
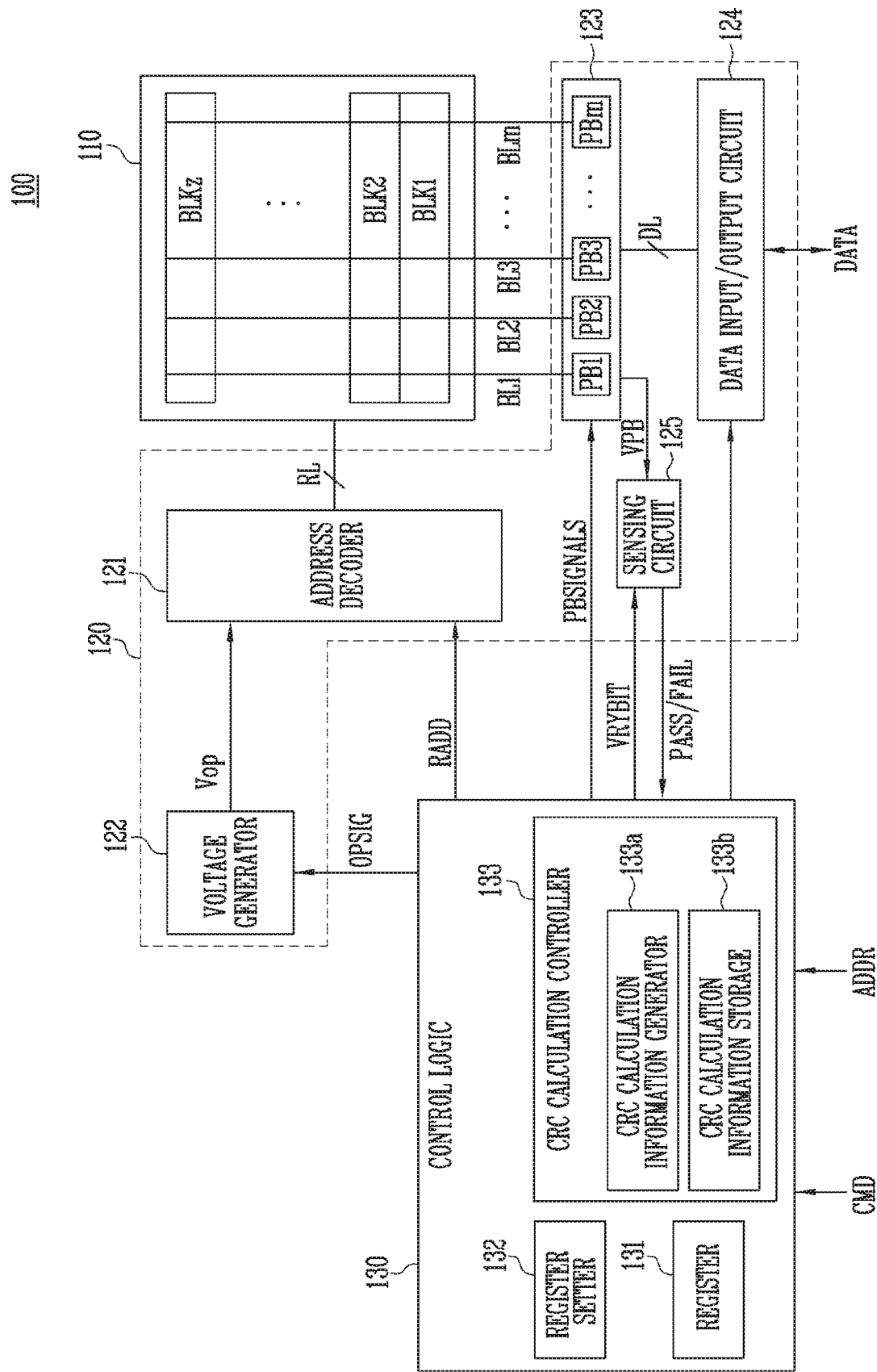
FIG. 2 is a diagram illustrating a structure of a memory device, such as that shown in FIG. 1.

FIG. 2 is a diagram illustrating a structure of the memory device, such as that shown in FIG. 1.

The memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells.

In an embodiment, the plurality of memory cells may be nonvolatile memory cells. Among the plurality of memory cells, memory cells coupled to the same word line may be defined as one page. That is, the memory cell array 110 may include a plurality of pages. According to an embodiment of the present disclosure, each of the plurality of memory blocks BLK1 to BLKz included in the memory cell array 110 may include a plurality of dummy cells. One or more dummy cells may be coupled in series between a drain select transistor and memory cells and a source select transistor and the memory cells.

Each of the memory cells of the memory device 100 may be a single level cell (SLC) for storing one data bit, a multi-level cell (MLC) for storing two data bits, a triple level cell (TLC) for storing three data bits, or a quad level cell (QLC) for storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may driver the memory cell array 110 to perform a program operation, a read operation, and an erase operation.

The address decoder 121 is coupled to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address RADD in the received address ADDR. The address decoder 121 may select at least one word line WL of the selected memory block by applying voltages provided from the voltage generator 122 to the word line WL according to the decoded row address RADD.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

According to an embodiment of the present disclosure, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

According to an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of voltages by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated voltages Vop may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal or fail signal to the control logic 130 by comparing a sensing voltage VPB received from the read/write circuit 123 and a reference voltage generated by the reference current.

The control logic 130 may be coupled to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 126. Also, the control logic 130 may determine whether the verify operation has passed or failed in response to the pass or fail signal PASS/FAIL output by the sensing circuit 126.

In an embodiment, the control logic 130 may include the register 131, the register setter 132, and the CRC calculation controller 133.

The register 131 may include a latch circuit for storing data. The register 131 may store a plurality of parameters representing device setting information related to the memory device 100. In a booting operation, the memory device 100 may read device setting information from the memory cell array 110 and store the read device setting information in the register 131, in response to an initialization command provided by the memory controller 200 described with reference to FIG. 1.

The device setting information may include at least one of bad block information, column repair information, and logic information. The bad block information may represent initial bad memory blocks among the plurality of memory blocks included in the memory device 100. The column repair information may represent a bad column of the memory cell array 110. The logic information may represent a program bias, a read bias, an erase bias, and the like as conditions necessary for an operation of the memory device 100.

A string of data bits representing the device setting information may be repeated a certain number of times and be stored in memory blocks. Therefore, the device setting information may be read according to a multi-bit check scheme. According to the multi-bit check scheme, data bits of a specific length are repeatedly read a set number of times. When the read data bits of the specific length have the same pattern a reference number of times, the data bits may be detected as a specific data (e.g., the device setting information).

The register setter 132 may change a selected parameter among the plurality of parameters stored in the register 131 in response to a parameter change command provided by the memory controller 200. When the register setter 132 changes the selected parameter, the register setter 132 may provide a CRC calculation control signal to the CRC calculation controller 133. The CRC calculation signal may be a signal for instructing a CRC calculation on all the plurality of parameters stored in the register 131. The plurality of parameters may include the changed parameter.

The register setter 132 may provide the selected parameter stored in the register 131 to the memory controller 200 in response to a parameter check command provided by the memory controller 200.

The CRC calculation controller 133 may include a CRC calculation information generator 133a and a CRC calculation information storage 133b.

When the selected parameter is changed among the plurality of parameters stored in the register 131, the CRC calculation information generator 133a may perform a CRC calculation on all the plurality of parameters stored in the register 131. In an embodiment, the CRC calculation information generator 133a may perform the CRC calculation on all the plurality of parameters in response to the CRC calculation signal provided by the register setter 132. The CRC calculation information generator 133a may generate CRC calculation information that is obtained by performing the CRC calculation, and provide the generated CRC calculation information to the CRC calculation information storage 133b. Whenever parameters stored in the register 131 are changed, the CRC calculation information generator 133a may update the CRC calculation information stored in the CRC calculation information storage 133b.

The CRC calculation information storage 133b may store and update the CRC calculation information. The CRC calculation controller 133 may provide the memory controller 200 with the CRC calculation information stored in the CRC calculation information storage 133b in response to a CRC calculation information request command provided by the memory controller 200. The CRC calculation information request command may be a get parameter command. The CRC calculation information stored in the CRC calculation information storage 133b may be updated whenever the parameters stored in the register 131 are changed.

Figure 3:
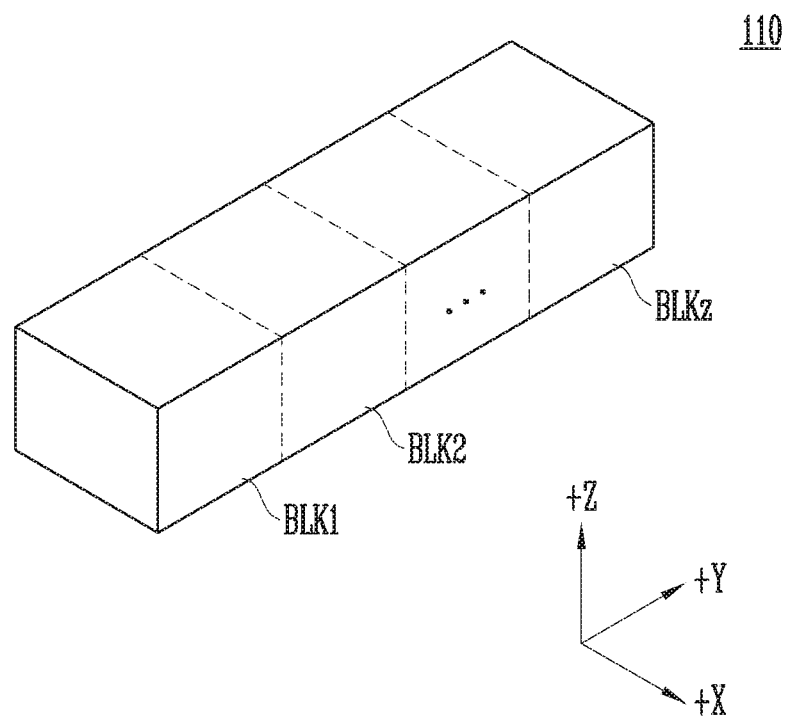
FIG. 3 is a diagram illustrating an embodiment of a memory cell array, such as that shown in FIG. 2.

FIG. 3 is a diagram illustrating an embodiment of the memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
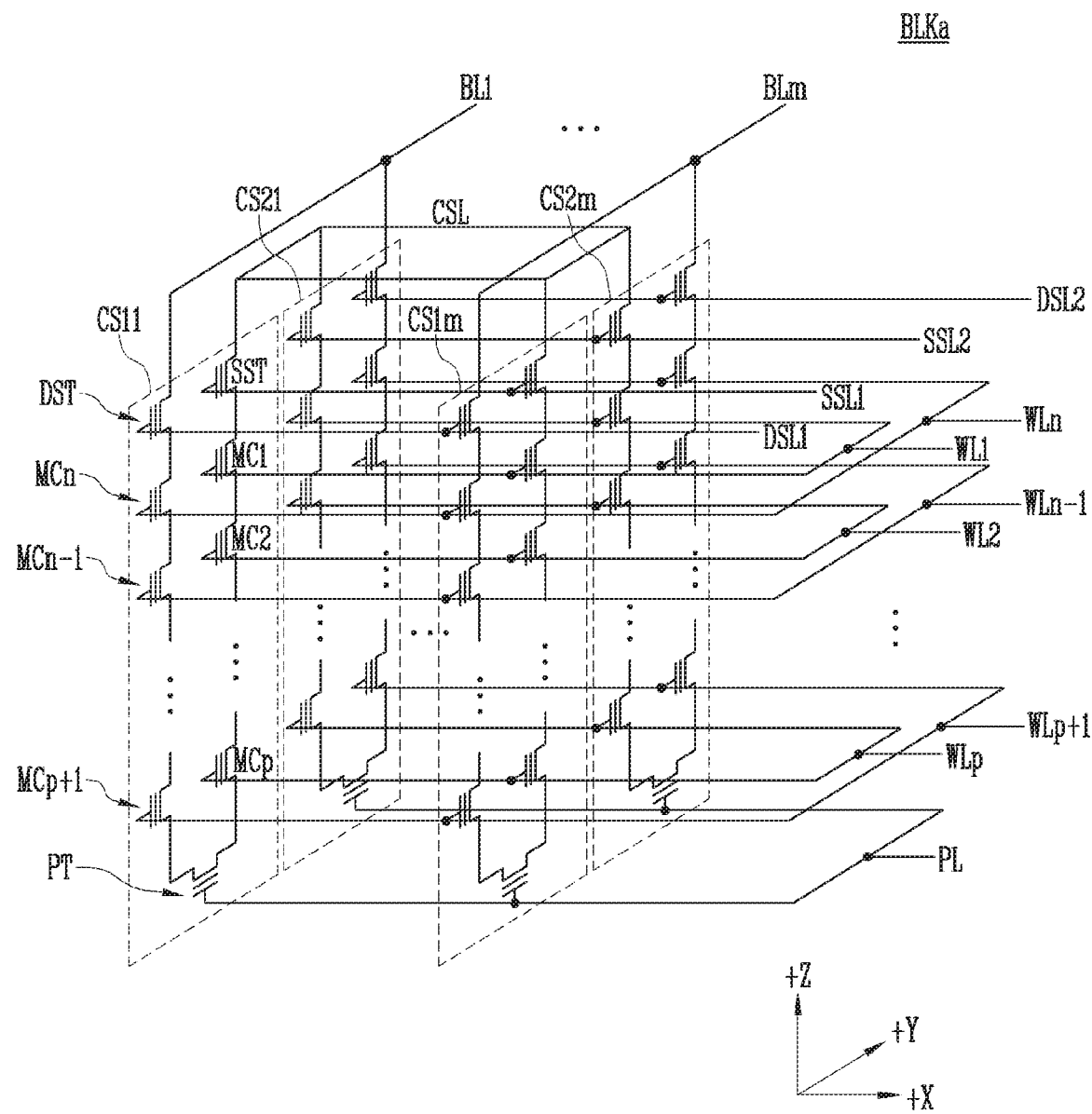
FIG. 4 is a circuit diagram illustrating any one memory block among memory blocks, such as those shown in FIG. 3.

FIG. 4 is a circuit diagram illustrating any memory block BLKa among memory blocks BLK1 to BLKz shown in FIG. 3.

Referring to FIG. 4, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 4 illustrates two cell strings arranged in a column direction (i.e., a +Y direction). However, this is for clarity, and it will be understood that three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1nn on a first row are coupled to a first source select line SSL1. The source select transistors of the cell strings CS21 to CS2m on a second row are coupled to a second source select line SSL2.

In another embodiment, the source select transistors of the cell strings CS11 to CS1nn and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1nn on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1nn and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1nn on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
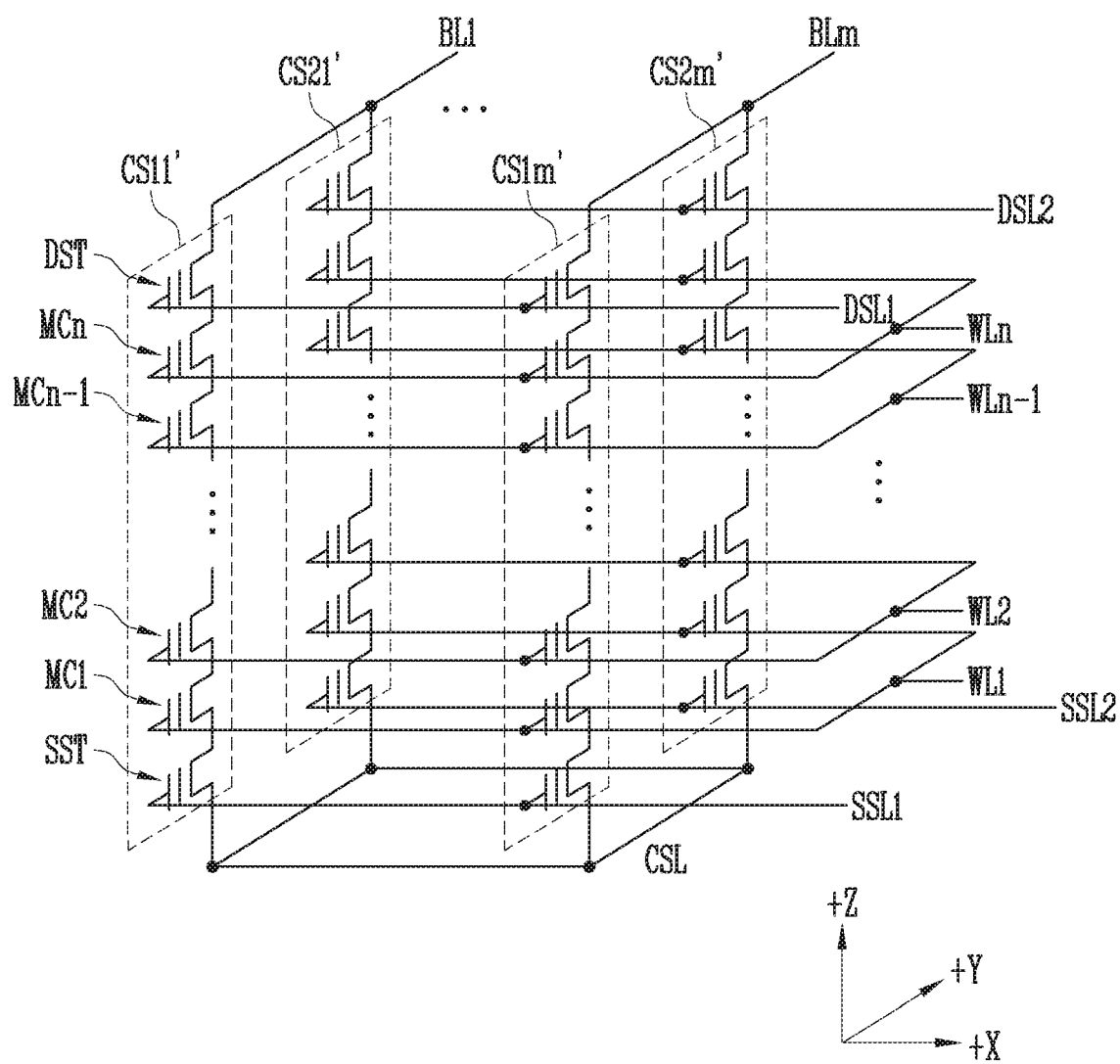
FIG. 5 is a circuit diagram illustrating another embodiment of a memory block among memory blocks, such as those shown in FIG. 3.

FIG. 5 is a circuit diagram illustrating another embodiment of a memory block BLKb among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4. For example, the pipe transistor PT that is include in each cell string in FIG. 4 is excluded from each cell string in FIG. 5.

In another embodiment, even bit lines and odd bit lines may be provided instead of the first to mth bit lines BL1 to BLm. In addition, even-numbered cell strings among the cell strings CS11' to CS1nn' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the dummy memory cell(s), each may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
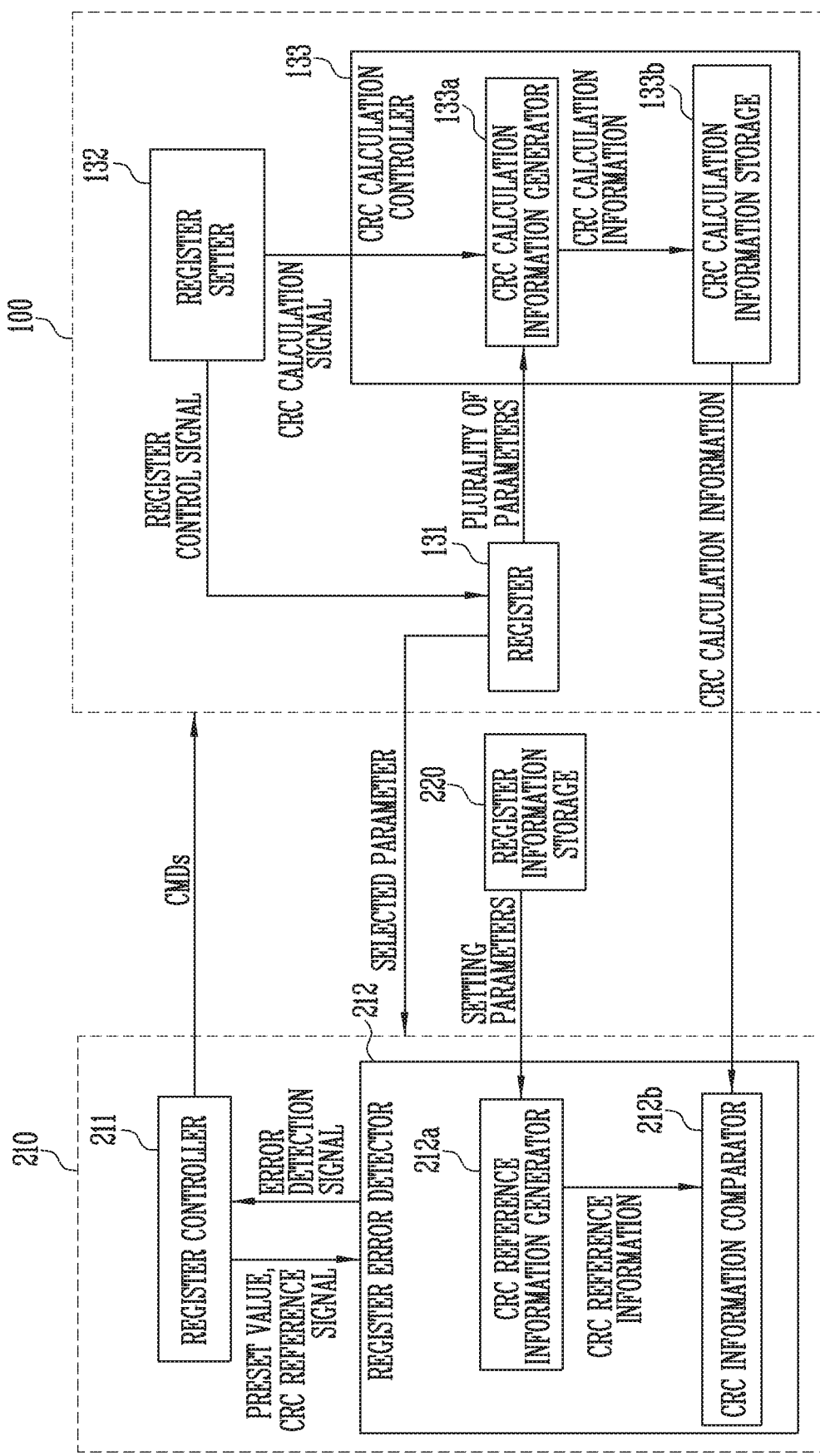
FIG. 6 is a diagram illustrating an operation of a memory controller and the memory device according to an embodiment of the present disclosure.

FIG. 6 is a diagram illustrating an operation of a memory controller and a memory device according to an embodiment of the present disclosure.

Referring to FIG. 6, the memory device 100 may include the register 131, the register setter 132, and the CRC calculation controller 133.

The register 131 may store a plurality of parameters representing device setting information related to the memory device 100. The device setting information may be information required to perform a read, program or erase operation of the memory device 100.

A selected parameter among the plurality of parameters stored in the register 131 may be changed according to a register control signal provided by the register setter 132. The plurality of parameters stored in the register 131 may be provided to a CRC calculation information generator 133a according to the register control signal. The plurality of parameters may include the selected parameter changed according to the register control signal. The selected parameter stored in the register 131 may be provided to a register error detector 212, which is included in the register manager 210 of the memory controller 200, according to the register control signal.

The register setter 132 may change the selected parameter among the plurality of parameters stored in the register 131 in response to a parameter change command provided by a register controller 211, which is included in the register manager 210 of the memory controller 200. For example, the register setter 132 may generate a register control signal for instructing a change of the selected parameter in response to the parameter change command, and provide the generated register control signal to the register 131.

The register setter 132 may provide the register 131 with a register control signal for instructing the plurality of parameters stored in the register 131 to be provided to the CRC calculation controller 133.

The register setter 132 may generate a CRC calculation signal and provide the generated CRC calculation signal to the CRC calculation controller 133. The CRC calculation signal may be a signal for instructing performance of a CRC calculation on all the plurality of parameters stored in the register 131.

The register setter 132 may provide the selected parameter stored in the register 131 to the register error detector 212 in response to a parameter check command provided by the register controller 211.

The CRC calculation controller 133 may include the CRC calculation information generator 133*a* and the CRC calculation information storage 133*b*.

The CRC calculation information generator 133*a* may generate CRC calculation information that is obtained by performing a CRC calculation on all the plurality of parameters stored in the register 131, in response to the CRC calculation signal provided by the register setter 132. The plurality of parameters may include the selected parameter changed according to the parameter change command.

The CRC calculation information storage 133*b* may store the CRC calculation information provided from the CRC calculation information generator 133*a*. The CRC calculation controller 133 may provide a CRC information comparator 212*b*, which is included in the register error detector 212 of the register manager 210 within the memory controller 200, with the CRC calculation information stored in the CRC calculation information storage 133*b* in response to a CRC calculation information request command provided by the register controller 211.

In an embodiment, the memory controller 200 described with reference to FIG. 1 may include the register manager 210 and the register information storage 220. The register manager 210 may include the register controller 211 and the register error detector 212.

The register controller 211 may manage the device setting information, which are stored in the register 131. The register controller 211 may set parameters representing the device setting information. The setting of a parameter may include addition, change or deletion of the parameter.

For example, the register controller 211 may provide the register setter 132 with a parameter change command for requesting the selected parameter, among the plurality of parameters stored in the register 131, to be changed to a set value. The register controller 211 may provide the set value to the register error detector 212. The register controller 211 may generate a CRC reference signal for instructing generation of CRC reference information, and provide the generate CRC reference signal to a CRC reference information generator 212*a*, which is included in the register error detector 212 of the register manager 210 within the memory controller 200.

The register controller 211 may provide the register setter 132 with a parameter check command for requesting the selected parameter among the plurality of parameters stored in the register 131. The parameter check command may be for acquiring the selected parameter from the register 131 for the register controller 211 to check whether the selected parameter has been correctly changed according to the parameter change command.

The register controller 211 may provide a CRC calculation information request command to the CRC calculation controller 133 so as to acquire CRC calculation information stored in the CRC calculation information storage 133*b*. The CRC calculation information stored in the CRC calculation information storage 133*b* may be provided to the CRC information comparator 212*b* as a result of executing the CRC calculation information request command.

The register error detector 212 may determine whether an error is included in the plurality of parameters stored in the register 131. The register setter 132 may change the selected parameter among the plurality of parameters in response to the parameter change command provided by the register controller 211.

In an embodiment, when the selected parameter does not have the set value notwithstanding the parameter change command, the register error detector 212 may determine that an error is included in the plurality of parameters stored in the register 131.

The register error detector 212 may determine whether an error is included in the plurality of parameters stored in the register 131 according to whether the selected parameter acquired by executing the parameter check command has the set value according to the parameter change command. When the acquired selected parameter does not have the set value, the register error detector 212 may determine that an error is included in the plurality of parameters stored in the register 131.

In another embodiment, when the other parameters have changed according to the parameter change command, the register error detector 212 may determine that an error is included in the plurality of parameters stored in the register 131.

When the acquired selected parameter has the set value, the register error detector 212 may determine whether the other parameters have changed according to the parameter change command. When the other parameters have changed according to the parameter change command, the register error detector 212 may determine that an error is included in the plurality of parameters stored in the register 131.

In an embodiment, the register error detector 212 may include the CRC reference information generator 212*a* and the CRC information comparator 212*b*.

The CRC reference information generator 212*a* may generate CRC reference information that is obtained by performing a CRC calculation on setting parameters stored in the register information storage 220. The setting parameters may include a setting parameter that corresponds to the selected parameter and is changed to a set value. Specifically, the setting parameter that corresponds to the selected parameter is changed by a control signal from the register controller 211, when the register controller 211 provides the parameter change command with the register setter 132.

The CRC information comparator 212*b* may compare the CRC reference information generated by the CRC reference information generator 212*a* with the CRC calculation information received from the CRC calculation information storage 133*b*. The CRC information comparator 212*b* may determine whether the other parameters have been changed according to the parameter change command according to whether the CRC reference information is the same as, or corresponds to, the CRC calculation information. When the CRC reference information is not the same as, or does not correspond to, the CRC calculation information, the CRC information comparator 212*b* may determine that the other parameters stored in the register 131 have been changed according to the parameter change command.

The register error detector 212 may provide the register controller 211 with an error detection signal representing whether an error is included in the plurality of parameters stored in the register 131.

When it is determined that an error is included in the plurality of parameters stored in the register 131, the error detection signal may have a logic value "high." When it is determined that no error is included in the plurality of parameters stored in the register 131, the error detection signal may have a logic value "low." In another embodiment, the logic value of the error detection signal may be inverted; that is, logic value "high" may indicate no error and logic value "low" may indicate the presence of an error.

When it is determined that an error is included in the plurality of parameters stored in the register 131, the register controller 211 may initialize the register 131. Specifically, when the register controller 211 receives the error detection signal representing the logic value "high" from the register error detector 212, the register controller 211 may initialize the register 131.

The register controller 211 may provide the register setter 132 with an initialization command for initializing the register 131. The register setter 132 may set the plurality of parameters stored in the register 131 to an initial value in response to the initialization command. In order to set the plurality of parameters to the initial value, the register setter 132 may read device setting information, which are stored in a memory block, and store the read device setting information in the register 131.

When power is supplied to the memory device 100, the register information storage 220 may receive a plurality of parameters stored in the register 131, and store therein the plurality of received parameters as setting parameters respectively corresponding to the plurality of parameters. The plurality of parameters may represent device setting information. The register information storage 220 may perform an update operation, periodically or on demand, on the plurality of parameters provided from the memory device 100 and store the updated parameters as the setting parameters.

Figure 7:
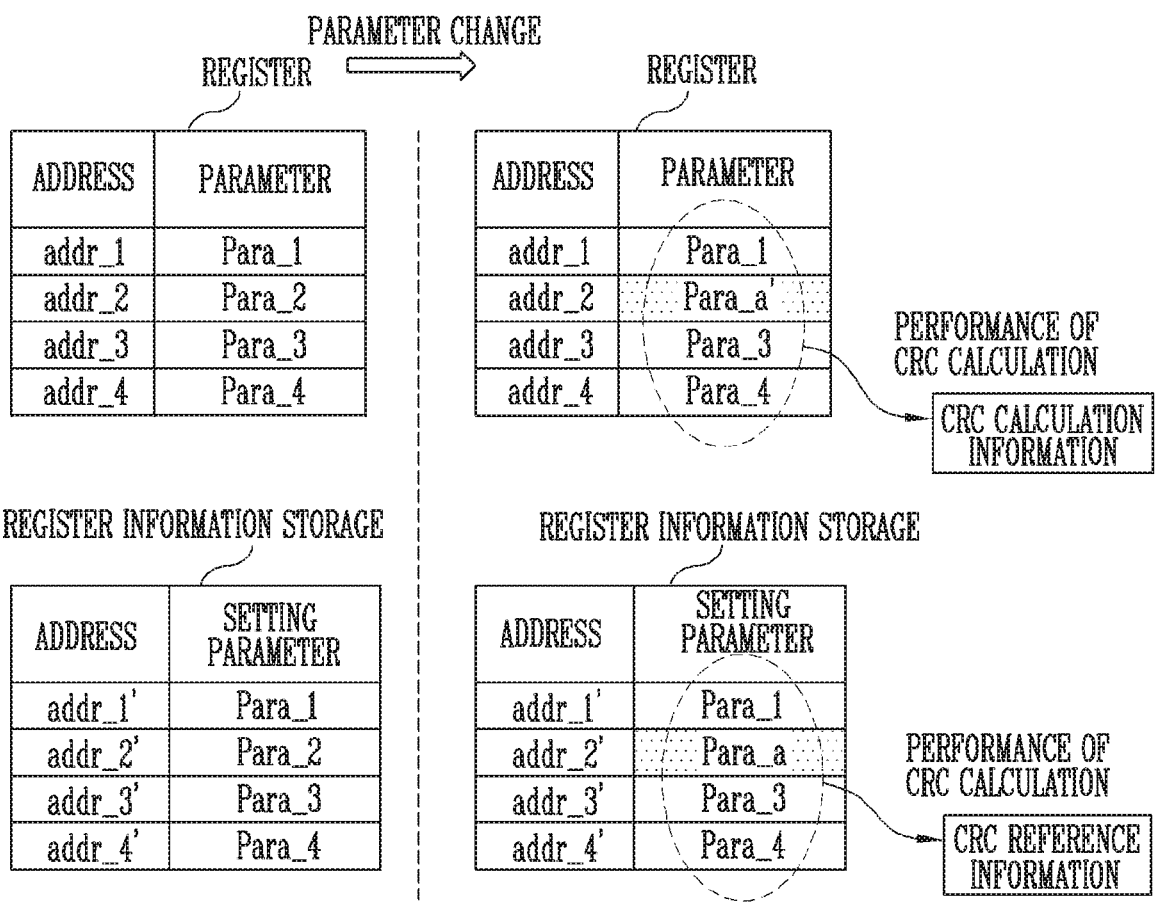
FIG. 7 is a diagram illustrating cyclic redundancy check (CRC) calculation information and CRC reference information.

FIG. 7 is a diagram illustrating the CRC calculation information and the CRC reference information, which are shown in FIG. 6.

Referring to FIG. 7, the register 131 may be divided into a plurality of address regions. The plurality of address regions may store a plurality of corresponding parameters, respectively. The plurality of parameters stored in the register 131 may represent the device setting information.

For example, the device setting information stored in the register 131 may be represented by data bits of a set size. The data bits may be consecutively repeated a certain number of times and be stored in a memory block. The data bits representing the device setting information may be read according to a multi-bit check scheme. Initial values of the plurality of parameters may be results obtained by reading the data bits representing the device setting information from the memory block according to the multi-bit check scheme.

In FIG. 7, the register 131 may include first to fourth address regions addr_1 to addr_4. The first to fourth address regions addr_1 to addr_4 may store first to fourth parameters Para_1 to Para_4, respectively. The number of address regions included in the register 131 and the number of parameters stored in the address regions are not limited to this embodiment.

The memory device 100 may change a selected parameter among the plurality of parameters stored in the register 131 in response to a parameter change command provided by the memory controller 200. The parameter change command may be a set parameter command.

The memory device 100 may provide the memory controller 200 with the selected parameter among the plurality of parameters stored in the register 131 in response to a parameter check command provided by the memory controller 200. The parameter check command may be a get parameter command.

The CRC calculation information may be obtained by performing a CRC calculation on all the plurality of parameters stored in the register 131. The CRC calculation may be an exclusive OR (XOR) calculation on input data with a CRC polynomial code. The XOR calculation may be performed a set number of times. The CRC polynomial code may have a certain length of bits. In an embodiment, a CRC polynomial code CRC-32 may have a length of 32 bits.

The CRC calculation on all the plurality of parameters may be performed when a selected parameter, among the plurality of parameters stored in the register 131, is changed.

For example, the second parameter Para_2 stored in the second address region addr_2 included in the register 131 may be changed according to a parameter change command provided by the memory controller 200. The parameter change command may be for requesting the second parameter Para_2 to be changed to a parameter Para_a having a set value. A second parameter Para_a', changed as a result obtained by executing the parameter change command, may be equal to or different from the parameter Para_a having the set value.

The CRC calculation information may be obtained by performing a CRC calculation on the plurality of parameters including the selected parameter changed in response to the parameter change command.

For example, the CRC calculation information may be obtained by performing a CRC calculation on all the first parameter Para_1, the second parameter Para_a', the third parameter Para_3, and the fourth parameter Para_4, which are stored in the register 131. The CRC calculation information may be obtained by performing, by a certain number of times, an XOR calculation on all the first parameter Para_1, the second parameter Para_a', the third parameter Para_3, and the fourth parameter Para_4 with the CRC polynomial code CRC-32.

The register information storage 220 may store the plurality of parameters stored in the register 131 as setting parameters respectively corresponding to the plurality of parameters. The register information storage 220 may include first to fourth address regions addr_1' to addr_4'. The first to fourth address regions addr_1' to addr_4' may store first to fourth setting parameters Para_1 to Para_4 corresponding to the first to fourth parameters Para_1 to Para_4, respectively. The number of address regions included in the register information storage 220 and the number of setting parameters stored in the address regions are not limited to the embodiment illustrated in FIG. 7.

The CRC reference information may be obtained by performing a CRC calculation on all the setting parameter including a setting parameter that corresponds to the selected parameter and is changed to a set value.

For example, the second setting parameter Para_2 may be changed to a parameter Para_a having the set value. The CRC reference information may be obtained by performing a CRC calculation on all the first setting parameter Para_1, the second setting parameter Para_a, the third setting parameter Para_3, and the fourth setting parameter Para_4, which are stored in the register information storage 220. The CRC reference information may be obtained by performing, a certain number of times, an XOR calculation on all the first setting parameter Para_1, the second setting parameter Para_a, the third setting parameter Para_3, and the fourth setting parameter Para_4, which are stored in the register information storage 220, with the CRC polynomial code CRC-32.

In an embodiment, according to whether the CRC reference information is the same as, or corresponds to, the CRC calculation information, it may be determined whether the selected parameter has been normally changed to the set value according to the parameter change command. When the CRC reference information is the same as, or corresponds to, the CRC calculation information, that indicates that the selected parameter has been normally changed to the set value. When the CRC reference information is not the same as, or does not correspond to, the CRC calculation information, that indicates that the selected parameter has been changed to a value different from the set value. Alternatively, when the CRC reference information is not the same as, or does not correspond to, the CRC calculation information, that indicates that the other parameters, i.e., parameters other than the selected parameter, have been changed.

Figure 8:
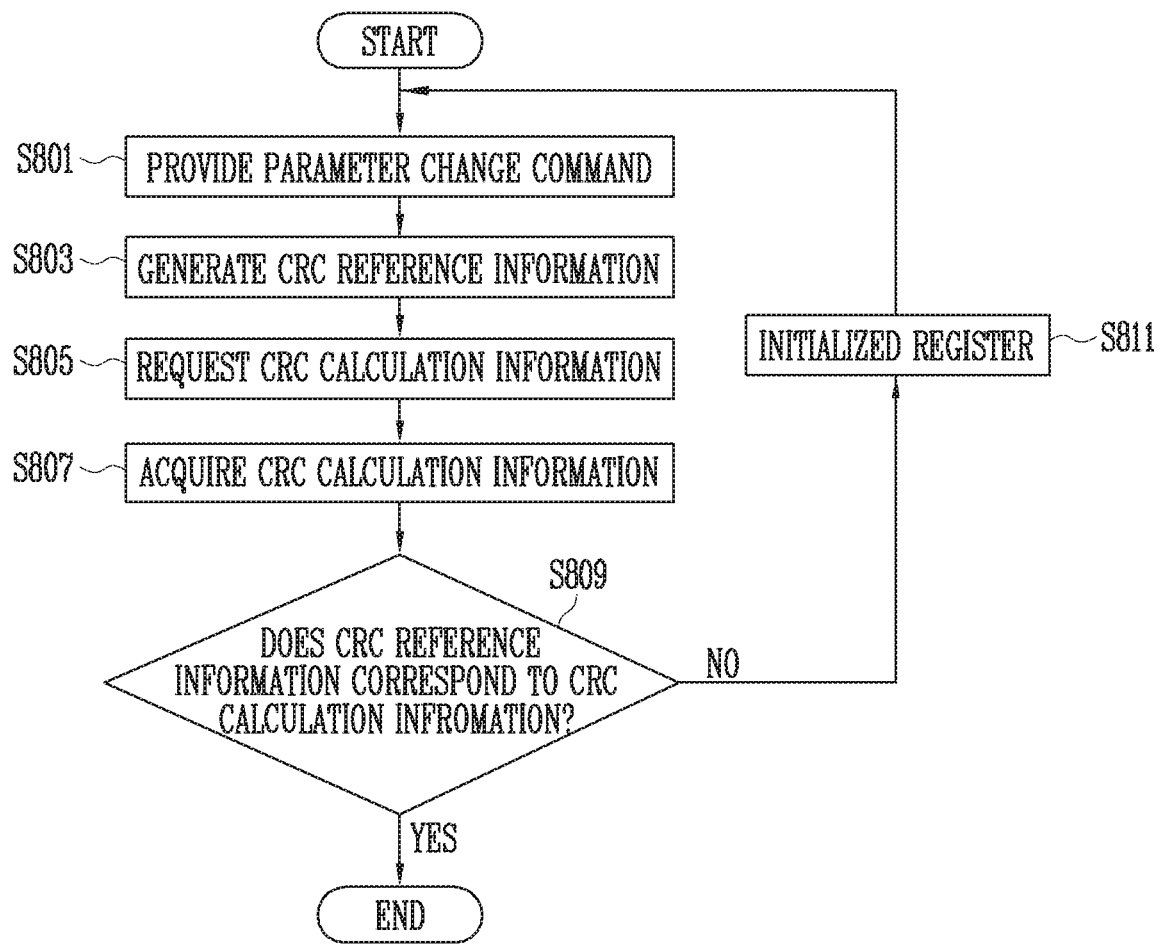
FIG. 8 is a flowchart illustrating an operation of a memory controller according to an embodiment of the present disclosure.

FIG. 8 is a flowchart illustrating an operation of a memory controller, e.g., memory controller 200, according to an embodiment of the present disclosure.

Referring to FIG. 8, in step S801, the memory controller 200 may provide a parameter change command to the memory device 100 for requesting a selected parameter, among a plurality of parameters stored in the register 131, to be changed to a set value. Plus, a setting parameter corresponding to the selected parameter, among setting parameters stored in the register information storage 220, is to be changed when the memory controller 200 provides the parameter change command to the memory device 100.

In step S803, the memory controller 200 may generate CRC reference information on the setting parameters stored in the register information storage 220.

In step S805, the memory controller 200 may provide the memory device 100 with a CRC calculation information request command for requesting CRC calculation information on the parameters stored in the register 131.

In step S807, the memory controller 200 may acquire CRC calculation information from the memory device 100 according to the CRC calculation information request command.

In step S809, the memory controller 200 may determine whether the generated CRC reference information is the same as, or corresponds to, the acquired CRC calculation information. When it is determined that the CRC reference information is the same as, or corresponds to, the CRC calculation information (that is, "YES" at step S809), the process may end. Otherwise (that is, "NO" at step S809), the process proceeds to step S811.

In the step S811, the memory controller 200 may initialize the register 131. For example, the memory controller 200 may provide the memory device 100 with an initialization command for initializing the register 131. The initialization command may be for setting each of a plurality of parameters stored in the register 131 to a set initial value. The set initial value is stored in system blocks in the memory device 100. When the register 131 is initialized, the setting parameters stored in the register information storage 220 are deleted. After the register 131 is initialized, the register information storage 220 stores a plurality of parameters received form the initialized the register 131 as setting parameters.

Figure 9:
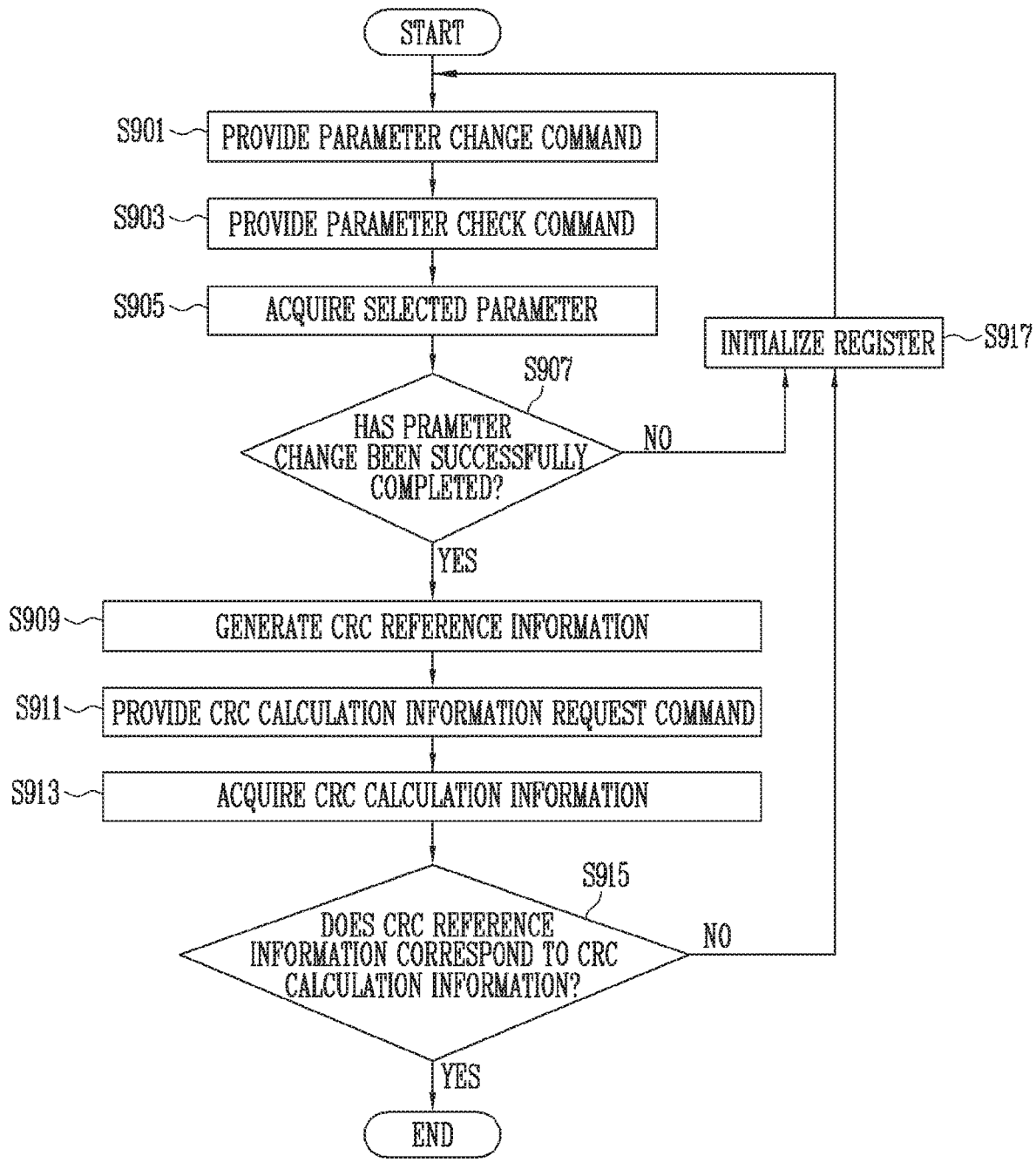
FIG. 9 is a flowchart illustrating an operation of a memory controller according to another embodiment of the present disclosure.

FIG. 9 is a flowchart illustrating an operation of a memory controller, e.g., memory controller 200, according to another embodiment of the present disclosure.

Referring to FIG. 9, in step S901, the memory controller 200 may provide a parameter change command to the memory device 100. The parameter change command may be for requesting a selected parameter, among a plurality of parameters stored in the register 131, to be changed to a set value.

In step S903, the memory controller 200 may provide a parameter check command to the memory device 100. The parameter check command may be for requesting the selected parameter to be changed to a set value.

In step S905, the memory controller 200 may acquire the selected parameter from the memory device 100 according to the parameter check command.

In step S907, the memory controller 200 may determine whether the parameter change has been successfully completed. When it is determined that the parameter change has been successfully completed (that is, "YES" at step S907), the process proceeds to step S909. Otherwise (that is, "NO" at step S907), the process proceeds to step S917.

For example, the memory controller 200 may determine whether the selected parameter acquired in response to the parameter check command has the set value according to the parameter change command. When the selected parameter has the set value, the memory controller 200 may determine that the parameter change has been successfully completed. When the selected parameter does not have the set value, the memory controller 200 may determine that the parameter change has not been successfully completed.

In the step S909, the memory controller 200 may generate CRC reference information on the setting parameters stored in the register information storage 220. Plus, a setting parameter corresponding to the selected parameter, among the setting parameters stored in the register information storage 220, is to be changed when the memory controller 200 provides the parameter change command to the memory device 100 in the step S901.

In step S911, the memory controller 200 may provide the memory device 100 with a CRC calculation information request command for requesting CRC calculation information on the parameters stored in the register 131 within the memory device 100.

In step S913, the memory controller 200 may acquire CRC calculation information from the memory device 100 according to the CRC calculation information request command.

In step S915, the memory controller 200 may determine whether the generated CRC reference information is the same as, or corresponds to, the acquired CRC calculation information. When it is determined that the CRC reference information is the same as, or corresponds to, the CRC calculation information (that is, "YES" at step S915), the process may end. Otherwise (that is, "NO" at step S915), the process proceeds to the step S917.

In the step S917, the memory controller 200 may initialize the register 131. As above mentioned, in the step 811 in FIG. 8

Figure 10:
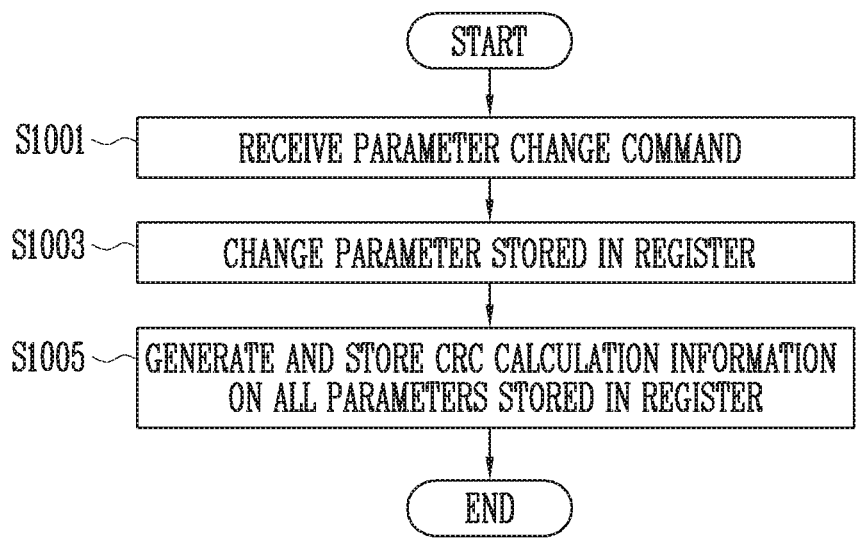
FIG. 10 is a flowchart illustrating an operation of a memory device according to an embodiment of the present disclosure.

FIG. 10 is a flowchart illustrating an operation of a memory device, e.g., the memory device 100, according to an embodiment of the present disclosure.

Referring to FIG. 10, in step S1001, the memory device 100 may receive a parameter change command from the memory controller 200.

In step S1003, the memory device 100 may change a selected parameter stored in the register 131 in response to the parameter change command.

In step S1005, the memory device 100 may generate and store CRC calculation information that is obtained by performing a CRC calculation on all the plurality of parameters stored in the register 131.

Figure 11:
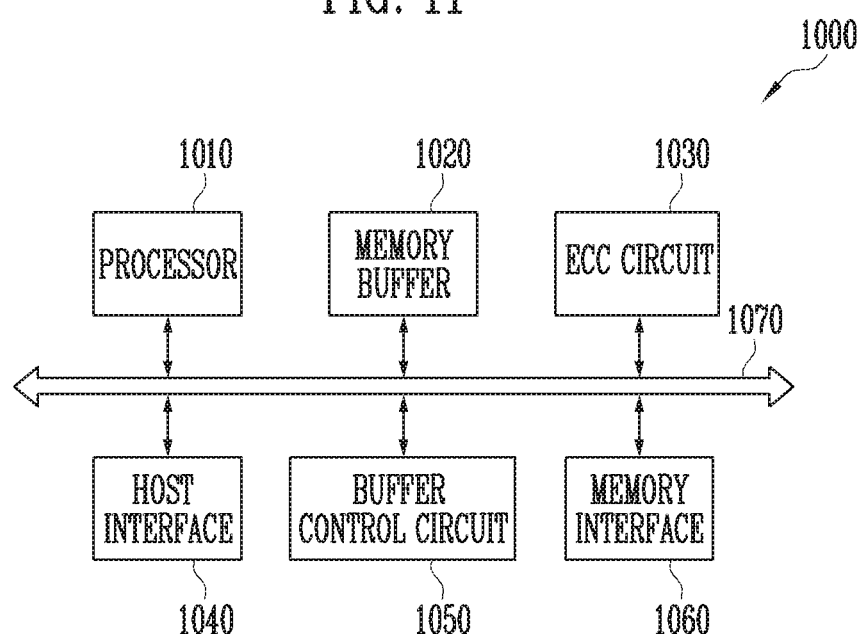
FIG. 11 is a diagram illustrating another embodiment of a memory controller, such as that shown in FIG. 1.

FIG. 11 is a diagram illustrating another embodiment of the memory controller shown in FIG. 1.

A memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

Referring to FIG. 11, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an embodiment, the memory controller 1000 may not include the memory buffer 1020 and the buffer control circuit 1050, either of which may be provided separately or one or both of their functions may be distributed to other components of the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 12:
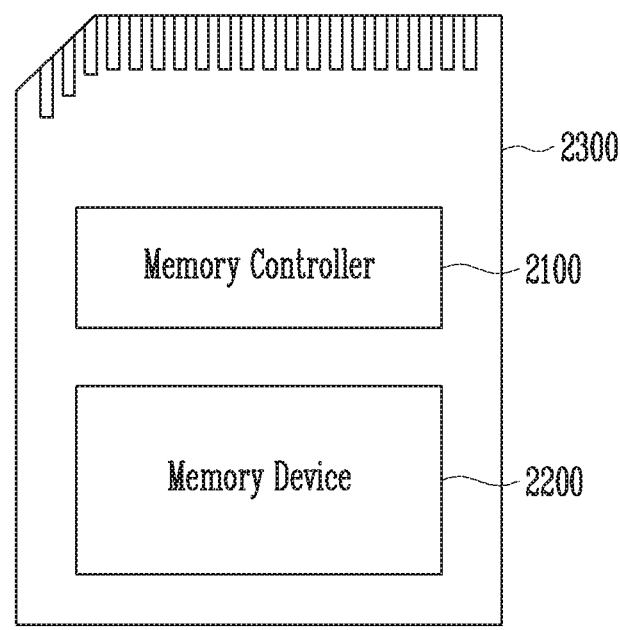
FIG. 12 is a block diagram illustrating a memory card system to which the storage device is applied according to an embodiment of the present disclosure.

FIG. 12 is a block diagram illustrating a memory card system to which the storage device is applied according to an embodiment of the present disclosure.

Referring to FIG. 12, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

In an example, the memory controller 2100 may include components such as a Random Access Memory (RAM), a processor, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with any of various nonvolatile memory devices such as an Electrically Erasable and Programmable ROM (EPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device to constitute a memory card such as a PC card (Personal Computer Memory Card International Association (PCM-CIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and/or a Universal Flash Storage (UFS).

Figure 13:
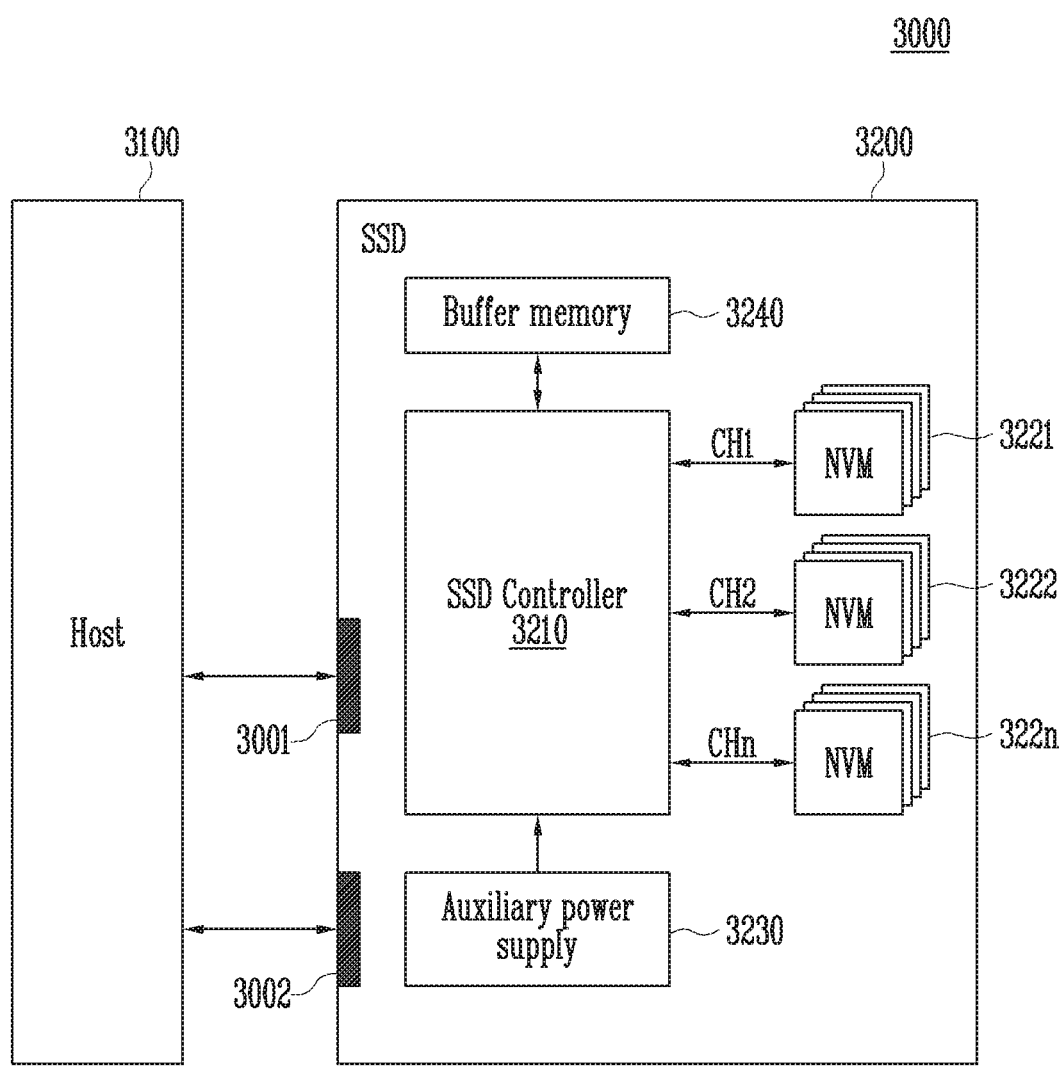
FIG. 13 is a block diagram exemplarily illustrating a Solid State Drive (SSD) system to which the storage device is applied according to an embodiment of the present disclosure.

FIG. 13 is a block diagram illustrating a Solid State Drive (SSD) system to which the storage device is applied according to an embodiment of the present disclosure.

Referring to FIG. 13, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be based on an interface between the host 3100 and the SSD 3200. For example, the signal SIG may be defined by at least one of interfaces such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located externally to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 14:
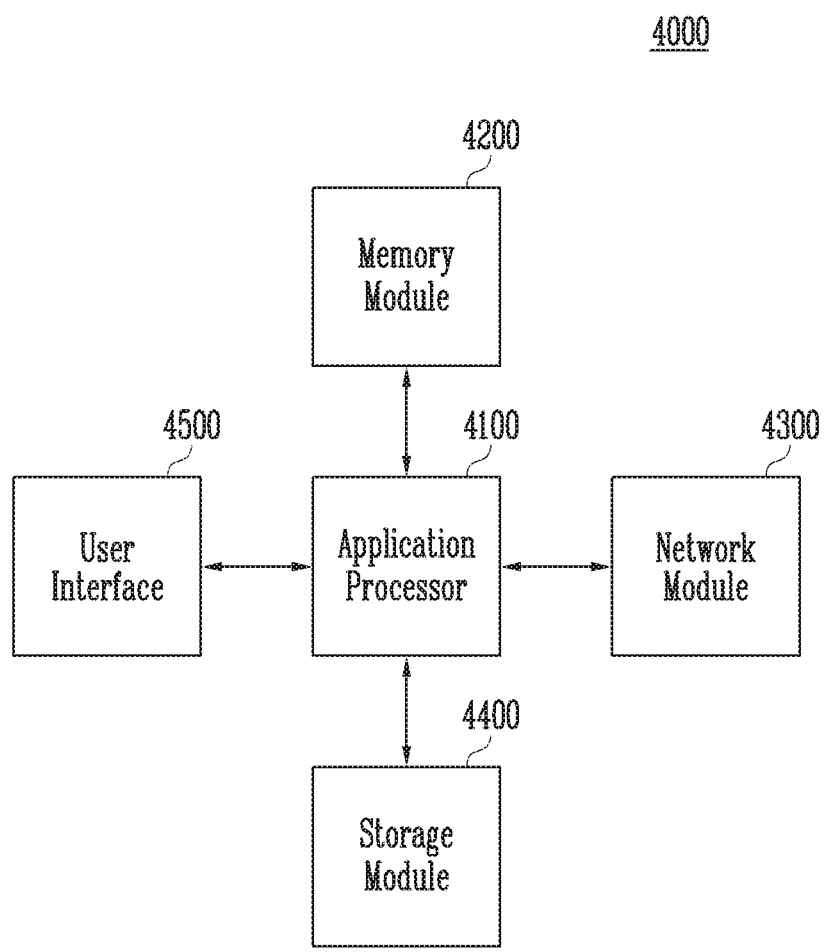
FIG. 14 is a block diagram illustrating a user system to which the storage device is applied according to an embodiment of the present disclosure.

FIG. 14 is a block diagram illustrating a user system to which the storage device is applied according to an embodiment of the present disclosure.

Referring to FIG. 14, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or volatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device described with reference to FIG. 1. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a motor.

According to embodiments of the present disclosure, a storage device having improved reliability and an operating method thereof are provided.

While the present invention has been shown and described with reference to certain embodiments thereof, it will be understood by those skilled in the art in light of the present disclosure that various changes in form and details may be made therein without departing from the spirit and scope of the present disclosure as defined by the appended claims and their equivalents. Therefore, the scope of the present invention should not be limited to the above-described embodiments but should be determined by the appended claims and equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are provided to facilitate an understanding of the present invention, not to limit it. That is, it should be apparent to those skilled in the art that various modifications can be made on the basis of the technological scope of the present disclosure.

Although specific terminologies are used here to explain the embodiments of the present invention, such use is not intended to limit the scope of the present invention. Many variations and modifications are possible within the spirit and scope of the present disclosure, as will be apparent to those skilled in the art. The present invention encompasses all such variations and modifications to the extent they fall within the scope of the claims.

What is claimed is:

1. A memory controller for controlling a memory device including a register for storing a plurality of parameters, the memory controller comprising:
    a register information storage configured to receive, when power is supplied to the memory device, the plurality of parameters from the memory device, and store the plurality of parameters as a plurality of setting parameters respectively corresponding to the plurality of parameters;
    a register controller configured to provide the memory device with a parameter change command for requesting a selected parameter, among the plurality of parameters, to be changed to a set value, and acquire, from the memory device, Cyclic Redundancy Check (CRC) calculation information that is obtained by performing a CRC calculation on the plurality of parameters including the selected parameter changed in response to the parameter change command;
    a CRC reference information generator configured to generate CRC reference information by performing a CRC calculation on the plurality of setting parameters including a setting parameter that corresponds to the selected parameter and is changed to the set value; and
    a CRC information comparator configured to determine whether an error is included in the plurality of parameters according to a comparison result between the CRC calculation information and the CRC reference information,
    wherein the plurality of parameters represent device setting information related to the memory device, and
    wherein the device setting information is used in a read operation, a program operation or an erase operation of the memory device.

2. The memory controller of claim 1, wherein, when the CRC information comparator determines that an error is included in the plurality of parameters, the register controller provides the memory device with a command for initializing the register.

3. The memory controller of claim 1, wherein, when the CRC reference information is not the same as the CRC calculation information, the CRC information comparator determines that an error is included in the plurality of parameters.

4. The memory controller of claim 1,
    wherein the device setting information includes at least one of bad block information indicating a bad memory block of the memory device, column repair information indicating a bad column of the memory device, and logic information indicating an operating condition of the memory device.

5. The memory controller of claim 1,
    wherein the register controller provides the memory device with a get parameter command for requesting the CRC calculation information, and
    wherein the parameter change command includes a set parameter command.

6. A memory controller for controlling a memory device including a register for storing a plurality of parameters, the memory controller comprising:
    a register information storage configured to receive the plurality of parameters from the memory device and store the plurality of parameters as a plurality of setting parameters respectively corresponding to the plurality of parameters, when power is supplied to the memory device; and
    a register manager configured to provide the memory device with a parameter change command for requesting a selected parameter, among the plurality of parameters, to be changed to a set value, and determine whether an error is included in the plurality of parameters according to whether the selected parameter changed in response to the parameter change command includes the set value,
    wherein the plurality of parameters represent device setting information related to the memory device, and
    wherein the device setting information is used in a read operation, a program operation or an erase operation of the memory device.

7. The memory controller of claim 6, wherein, when the register manager determines that an error is included in the plurality of parameters, the register manager provides the memory device with a command for initializing the register.

8. The memory controller of claim 7, wherein the register manager includes:
    a register controller configured to provide the memory device with the parameter change command and a parameter check command for requesting the selected parameter; and
    a register error detector configured to determine whether an error is included in the plurality of parameters according to whether the selected parameter acquired in response to the parameter check command includes the set value.

9. The memory controller of claim 8, wherein, when the register error detector determines that the selected parameter does not include the set value, the register error detector determines that an error is included in the plurality of parameters.

10. The memory controller of claim 8, wherein, when the register error detector determines that the selected parameter includes the set value, the register controller acquires, from the memory device, Cyclic Redundancy Check (CRC) calculation information that is obtained by performing a CRC calculation on the plurality of parameters including the selected parameter changed in response to the parameter change command, and provides the CRC calculation information to the register error detector.

11. The memory controller of claim 10, wherein the register error detector includes:
a CRC reference information generator configured to generate CRC reference information by performing a CRC calculation on the plurality of setting parameters including a setting parameter that corresponds to the selected parameter and is changed to the set value; and
a CRC information comparator configured to determine whether the CRC reference information is the same as the CRC calculation information.

12. The memory controller of claim 11, wherein, when the CRC information comparator determines that the CRC reference information is not the same as the CRC calculation information, the register error detector determines that an error is included in the plurality of parameters.

13. The memory controller of claim 6,
wherein the device setting information includes at least one of bad block information representing a bad memory block of the memory device, column repair information representing a bad column of the memory device, and logic information representing an operating condition of the memory device.

14. A memory device comprising:
a register configured to store a plurality of parameters;
a register setter configured to change a selected parameter among the plurality of parameters in response to a parameter change command requesting a change of the selected parameter; and
a CRC calculation controller configured to perform a CRC calculation on the plurality of parameters including the selected parameter changed in response to the parameter change command,
wherein the plurality of parameters represent device setting information related to the memory device, and
wherein the device setting information is used in a read operation, a program operation or an erase operation of the memory device.

15. The memory device of claim 14,
wherein the device setting information includes at least one of bad block information representing a bad memory block of the memory device, column repair information representing a bad column of the memory device, and logic information representing an operating condition of the memory device.

16. A method for operating a memory controller for controlling a memory device including a register for storing a plurality of parameters, the method comprising:
receiving the plurality of parameters from the memory device and storing the plurality of parameters as a plurality of setting parameters respectively corresponding to the plurality of parameters in a register information storage, when power is supplied to the memory device;
providing the memory device with a parameter change command for requesting a selected parameter, among the plurality of parameters, to be changed to a set value;
acquiring, from the memory device, a Cyclic Redundancy Check (CRC) calculation information that is obtained by performing a CRC calculation on the plurality of parameters including the selected parameter changed in response to the parameter change command;
generating CRC reference information by performing a CRC calculation on the plurality of setting parameters including a setting parameter that corresponds to the selected parameter and is changed to the set value; and
determining whether an error is included in the plurality of parameters according to a comparison result between the CRC calculation information and the CRC reference information,
wherein the plurality of parameters represent device setting information related to the memory device, and
wherein the device setting information is used in a read operation, a program operation or an erase operation of the memory device.

17. The method of claim 16, further comprising initializing the register, when it is determined that an error is included in the plurality of parameters.

18. The method of claim 16,
wherein the device setting information includes at least one of bad block information representing a bad memory block of the memory device, column repair information representing a bad column of the memory device, and logic information representing an operating condition of the memory device.

19. A storage device comprising:
a memory device including a register configured to store a plurality of parameters representing device setting information related to the memory device: and
a memory controller configured to:
receive the plurality of parameters from the memory device and store the plurality of parameters as a plurality of setting parameters respectively corresponding to the plurality of parameters, when power is supplied to the memory device;
provide the memory device with a parameter change command for requesting a selected parameter, among the plurality of parameters, to be changed to a set value; and
determine whether an error is included in the plurality of parameters according to whether a result obtained by performing a Cyclic Redundancy Check (CRC) calculation on the plurality of setting parameters is the same as a result obtained by performing a CRC calculation on the plurality of parameters,
wherein the plurality of setting parameters include a setting parameter that corresponds to the selected parameter and is changed to the set value,
wherein the plurality of parameters include the selected parameter changed in response to the parameter change command, which are received from the memory device, and
wherein the device setting information is used in a read operation, a program operation or an erase operation of the memory device.

20. A memory system comprising:
a memory device configured to store a plurality of parameters representing device setting information; and a controller configured to:

control the memory device to change a selected parameter, among the plurality of parameters, to a set value, store the plurality of parameters as respective setting parameters and update, among the setting parameters, a selected setting parameter corresponding to the selected parameter according to the change of the selected parameter;

initialize the plurality of parameters stored in the memory device, when results of cyclic redundancy check (CRC) operations on all the plurality of parameters and all the setting parameters are different from each other, wherein the device setting information is used in a read operation, a program operation or an erase operation of the memory device.

* * * * *